(12) United States Patent
Ando et al.

(10) Patent No.: US 6,369,488 B1
(45) Date of Patent: Apr. 9, 2002

(54) PIEZOELECTRIC DEVICE

(75) Inventors: Akira Ando, Omihachiman; Masahiko Kimura, Kusatsu; Takuya Sawada, Moriyama, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/667,139

(22) Filed: Sep. 21, 2000

(30) Foreign Application Priority Data

| Sep. 22, 1999 | (JP) | 11-268651 |
| Mar. 27, 2000 | (JP) | 2000-086995 |
| Mar. 27, 2000 | (JP) | 2000-086996 |
| May 31, 2000 | (JP) | 2000-161833 |
| May 31, 2000 | (JP) | 2000-161834 |
| May 31, 2000 | (JP) | 2000-161835 |

(51) Int. Cl.[7] ............................................. H01L 41/08
(52) U.S. Cl. ........................ 310/320; 310/368; 310/358
(58) Field of Search ........................ 310/320, 365, 310/367, 368, 358

(56) References Cited

U.S. PATENT DOCUMENTS 4,676,993 A * 6/1987 Roberts et al. .............. 427/10
4,833,430 A * 5/1989 Roberts et al. ............. 333/191
4,924,132 A * 5/1990 Ziegler ....................... 310/361

* cited by examiner

Primary Examiner—Mark O. Budd
(74) Attorney, Agent, or Firm—Ostrolenk, Faber, Gerb & Soffen, LLP

(57) ABSTRACT

A piezoelectric device operable to excite a thickness extensional third harmonic vibration is provided, which can realize a high performance oscillator with an excellent thermal stability. The piezoelectric device includes a piezoelectric substrate. The piezoelectric substrate is formed from a piezoelectric material containing as major components Sr, Bi, Nb, and O. Vibration electrodes are formed on both of the surfaces of the piezoelectric substrate. The range lying between the vibration electrodes and defined by the overlapped vibration electrodes constitutes an energy trapping range. The value L/t is set to be less than 9, in which L represents the length of the longest secant extending between intersections on the periphery of the energy confining region and t represents the distance between the vibration electrodes.

21 Claims, 7 Drawing Sheets

POLARIZATION DIRECTION

—♦— PRINCIPAL VIBRATION

—△— ANHARMONIC OVERTONE

—▽— ANHARMONIC OVERTONE

–□– PRINCIPAL VIBRATION

–●– ANHARMONIC OVERTONE

–◆– ANHARMONIC OVERTONE

PIEZOELECTRIC DEVICE

BACKGROUND OF THE INVENTION

1. Field of the Invention

The present invention relates to a piezoelectric device, and more particularly to an energy trapping type piezoelectric device operable to use, e.g., a thickness extensional third harmonic vibration.

2. Description of the Related Art

Conventionally, energy trapping piezoelectric devices have been proposed, each of which has one pair of energy trapping vibration electrodes formed on opposite of the surfaces of a piezoelectric substrate to excite a thickness extensional third harmonic vibration. For a given material, the thickness extensional third harmonic vibration has a frequency constant which is about three times larger than that of the fundamental wave.

For piezoelectric devices which use a fundamental wave, the upper limit of the center frequency is about 15 MHz, considering the restrictions in strength of the piezoelectric substrates. On the other hand, the upper limits in center frequency of piezoelectric device using third harmonic waves are about 30 to 40 MHz. That is, the piezoelectric device can be used in a higher frequency range.

The optimum electrode structures of energy trapping piezoelectric devices operable to excite a thickness extensional third harmonic vibration are different, depending on type of material used. Thus, it is necessary to determine the optimum electrode size for each material type. In particular, it is well known that in an energy trapping piezoelectric device, the resonant frequency of spurious vibrations, called an anharmonic overtone, is present near the resonant frequency of the principal vibration. The anharmonic overtone is not excited when the electrode size (the energy trapping range) is small. The maximum electrode size where the anharmonic overtone is not excited depends on type of material used. Accordingly, it is necessary to determine the maximum electrode size for each type of material.

Unoriented bismuth layer-structure compound type ceramic materials have an excellent thermal stability. Thus, it would be expected that such structures could be used to achieve high performance piezoelectric devices. However, for the energy trapping piezoelectric devices operable to excite a thickness extensional third harmonic vibration, the maximum electrode sizes where anharmonic overtones are not excited have not been determined.

SUMMARY OF THE INVENTION

Accordingly, it is an object of the present invention to provide a piezoelectric device with which a high performance oscillator with an excellent thermal stability can be realized.

In accordance with the first aspect of the invention, the piezoelectric device comprises a piezoelectric substrate and at least a pair of vibration electrodes formed on opposite faces of the piezoelectric substrate. The piezoelectric substrate comprises of piezoelectric material containing as major components Sr, Bi, Nb and O. The vibration electrodes are formed so as to oppose each other and define an energy trapping region wherein a thickness extensional third harmonic wave is excited when an appropriate signal is applied across the pair of vibration electrodes. The energy trapping region is defined between the area of overlap of the vibration electrodes as viewed along a plane which runs parallel to the plane of the vibration electrodes. The length L of the longest secant extending between two intersections on the periphery of the energy confining region and the distance t between the pair of vibration electrodes satisfy the relationship L/t<9.

Instead of using Sr, Bi, Nb and O as major components of the piezoelectric material, Sr, Bi, Ti and O or Ca, Bi, Ti and O can be used as the major components. Preferably, $SrBi_2Nb_2O_9$ is employed as a major component.

A piezoelectric material containing Sr, Bi, Nb, and O as major components, such as $SrBi_2Nb_2O_9$ is thermally stable. If such a material is used to produce a piezoelectric device operable to excit a thickness extensional third harmonic vibration, and the value L/t is set to be less than 9, superposition of an anharmonic overtone can be avoided, and good energy-trapping can be performed.

The value L represents the maximum length of a secant extending between two intersections on the periphery of the energy confining region. This distance is measured along a plane which runs parallel to the planes of the vibration electrodes.

If the plan shape of the energy trapping range is circular, the reference character L represents the diameter of the circle. If the shape is elliptic, L represents the longer axis of the ellipse. If the shape is a rectangle or square, L represents the length of the diagonal.

BRIEF DESCRIPTION OF THE DRAWINGS

Other features and advantages of the present invention will become apparent from the following description of the invention which refers to the accompanying drawings.

DETAILED DESCRIPTION OF EMBODIMENTS OF THE INVENTION

Figure 1:
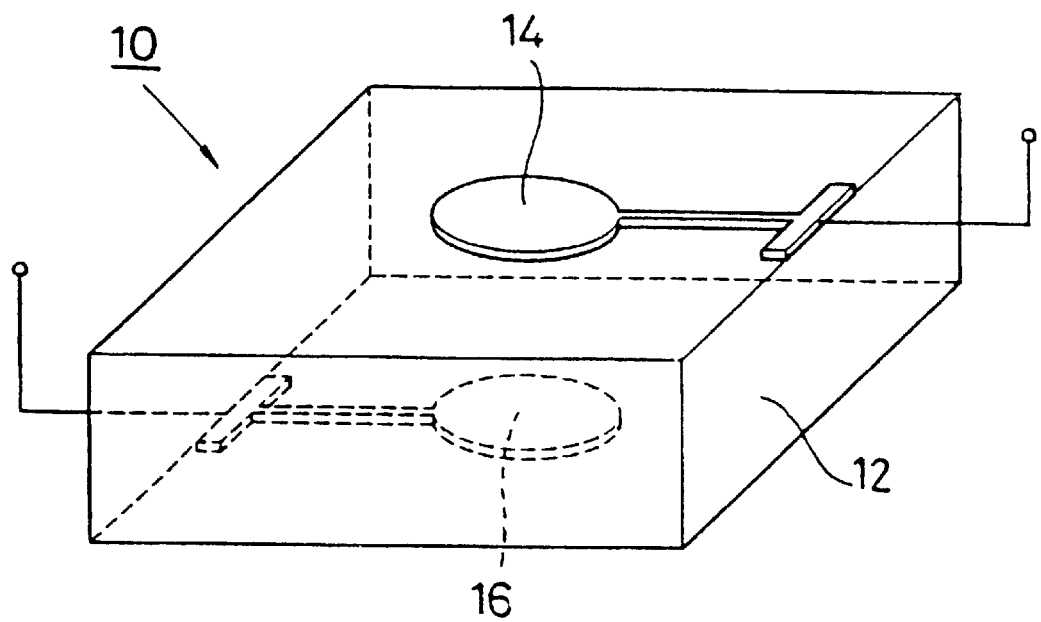
FIG. 1 illustrates an example of the piezoelectric device of the present invention.
Figure 2:
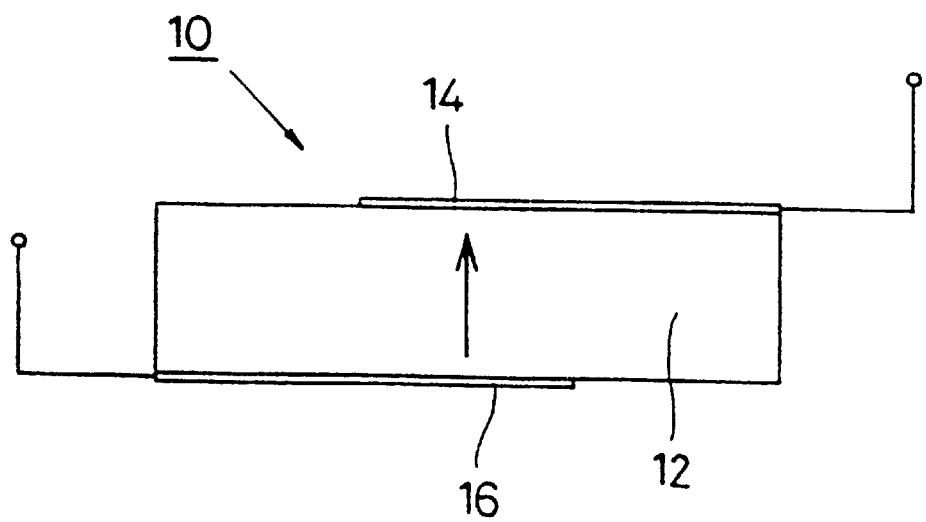
FIG. 2 illustrates the side of the piezoelectric device of FIG. 1.

Referring now to FIGS. 1 and 2, a piezoelectric device 10 contains a piezoelectric substrate 12 formed from a piezoelectric ceramic material containing as major components Sr, Bi, Nb, and O. By way of example, a material containing $SrBi_2Nb_2O_9$ as a major component may be used. Circular vibration electrodes 14 and 16 having substantially the same diameter are formed substantially in the centers of opposite faces of the piezoelectric substrate 12 so as to be opposed to each other. The vibration electrodes 14 and 16 extend (are led out) to opposite end portions of the piezoelectric substrate 12. The piezoelectric substrate 12 is polarized, for example, in the direction from the vibration electrode 16 to the vibration electrode 14. Alternatively, the piezoelectric substrate 12 may be polarized in the direction from the vibration electrode 14 to the vibration electrode 16.

Piezoelectric device 10 is used as an energy-trapping type piezoelectric device. The portion of the piezoelectric device 10 lying between the vibration electrodes 14 and 15 and defined by the area extending between the overlapping portions of the vibration electrodes 14 and 15 constitutes an energy-trapping area. The inventors have discovered that if the relationship between the maximum distance of a secant L which lies parallel to the plane of the electrodes 14 and 16 and which is defined by the intersection of the periphery of the energy confining region (in the piezoelectric element 10 shown in FIG. 1, the maximum length L corresponds to the diameter of the disk shaped vibration electrodes 14, 16) and the distance t between the vibration electrodes 14 and 16 is set in such a manner that the value L/t is less than 9, anharmonic overtones are suppressed.

Thus, the piezoelectric device 10, formed from a piezoelectric material containing Sr, Bi, Nb, and O as major components such as $SrBi_2Nb_2O_9$ or the like, can be used as a high performance oscillator having a high thermal stability at the same time that anharmonic overtones can be suppressed.

EXAMPLE 1

A series of piezoelectric device having the structure shown in FIGS. 1 and 2 were formed. The only difference between the samples was the diameter of the energy trapping region. In all cases, the piezoelectric substrate was formed as follows.

First, as starting materials, $SrCO_3$, $Bi_2O_3$, $Nb_2O_5$, and $MnCO_3$ were prepared. These raw materials were weighed and mixed to produce a composition of $SrBi_2Nb_2O_9$+1 wt. % $MnCO_3$. The mixed powder was calcined at a temperature of 800 to 1000° C. An appropriate amount of an organic binder was added and wet-pulverized for four hours by means a ball mill. The grain size was adjusted by passing the powder through a 40 mesh sieve.

The raw material of which the grain size was adjusted was molded under a pressure of 1000 kg/cm² into a rectangular sheet with a size of 30 mm×20 mm×1.0 mm thick, and fired at a temperature of 1250 to 1300° C. for 1 to 5 hours in the atmosphere to produce a porcelain having a rectangular sheet shape. The porcelain was cut and polished to form a square sheet of 5 mm×5 mm×0.4 mm thick. The square sheet was polarized in the thickness direction.

Thereafter, silver electrodes were formed by vapor-deposition on opposite main faces as shown in FIG. 2. The size of the electrodes was varied from sample to sample. The diameter of the energy trapping region, that is, the diameter of the circular portion of each of the vibration electrodes was varied to be from 1.0 to 5.2 mm.

Figure 3:
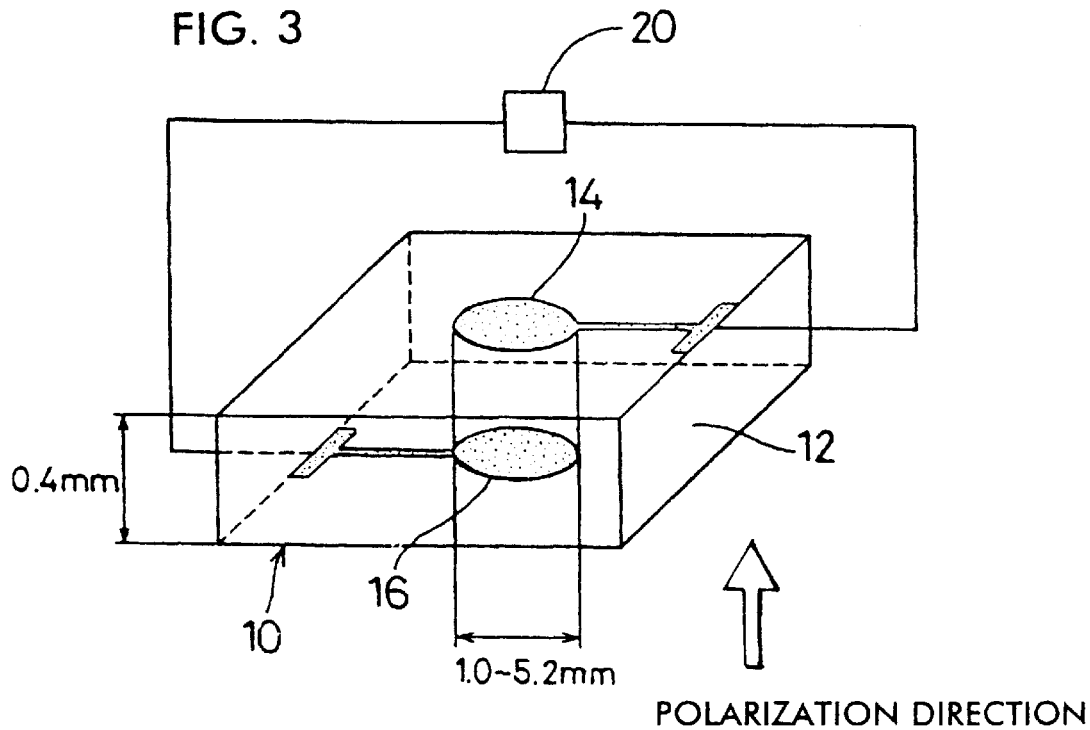
FIG. 3 illustrates a circuit diagram for estimating a piezoelectric device.
Figure 4:
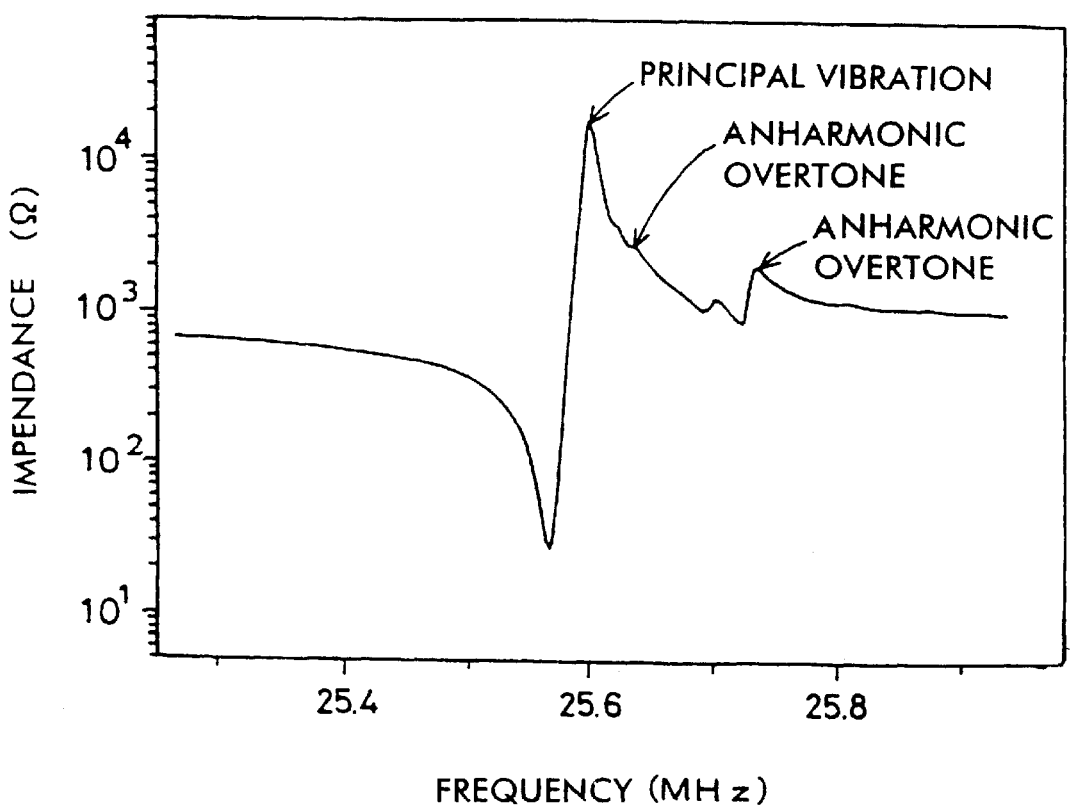
FIG. 4 is a graph showing the frequency characteristic of an impedance at an energy trapping range diameter of 3.6 mm.

For the purpose of estimating the energy trapping performance of the above-described piezoelectric device for a third harmonic wave, an impedance analyzer 20 was connected, as shown in FIG. 3, and the frequency characteristic of the impedance was measured. FIG. 4 is a graph showing the impedance—frequency characteristic for a sample with an electrode diameter of 3.6 mm. In this case, L is 3.6 mm, and t is 0.4 mm, that is, the value L/t is 9. It is seen that in the piezoelectric device, anharmonic overtones are superposed on the resonant frequencies of the principal vibration.

Figure 5:
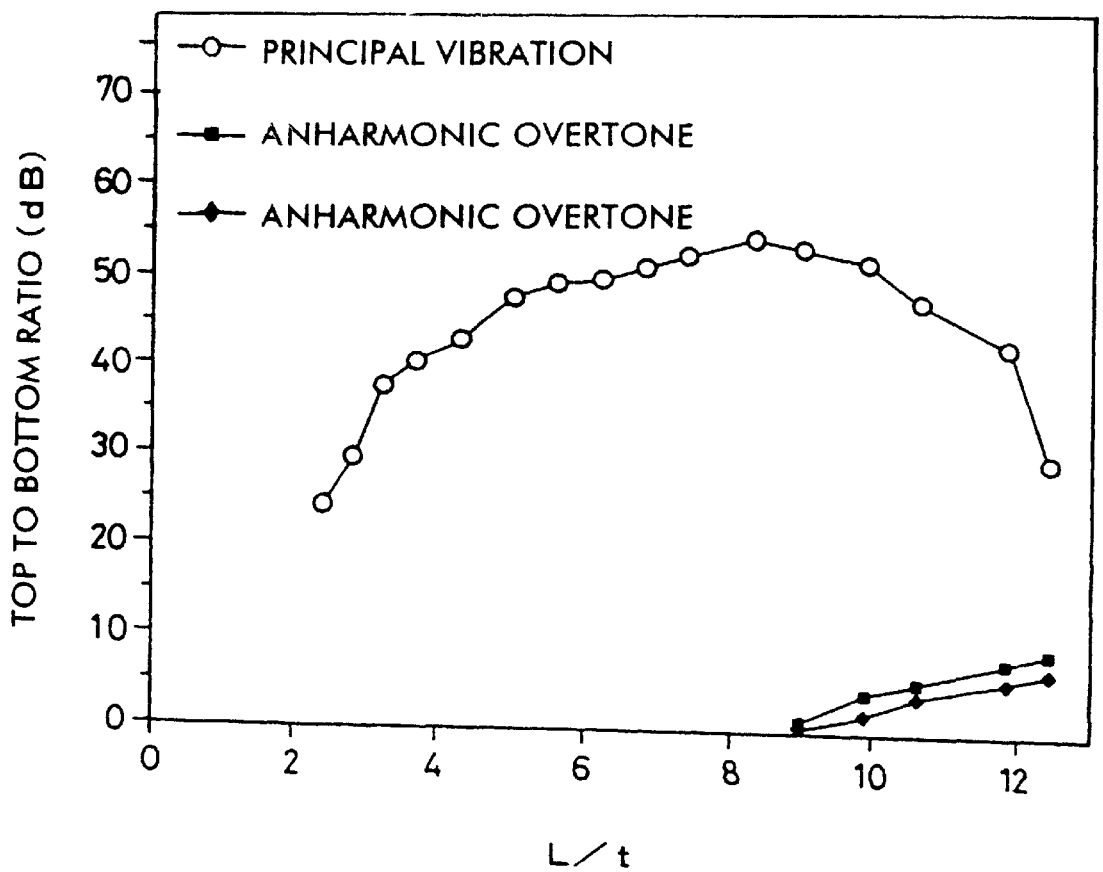
FIG. 5 is a graph showing the top-to-bottom ratio of the impedance in the piezoelectric device of Example 1 at different L/t values.

FIG. 5 shows the relationship of the index L/t to the top-to-bottom ratios (the ratio of the resonant impedance to the anti-resonant impedance) of the principal vibration and the anharmonic overtones based upon the test results of the various samples produced. As seen in FIG. 5, the anharmonic overtone are superposed when the value L/t is 9 or higher. When the piezoelectric device is used as an oscillator, the anharmonic overtone causes abnormal oscillation, termination of oscillation, etc. Further, when the piezoelectric device is used as a filter, the anharmonic overtone causes the problems that the attenuation is decreased, etc.

The present invention overcomes these problems by providing a piezoelectric device which has at least one pair of overlapping energy-trapping vibration electrodes formed on opposite faces of a piezoelectric substrate comprising a material containing as major components Sr, Bi, Nb, and O such as $SrBi_2Nb_2O_9$, which is a bismuth layer-structure compound type material, while at the same time exhibiting excellent thermal resistance by setting the size of the electrodes to have a value L/t of less than 9.

In the piezoelectric device of FIG. 1, the energy-trapping electrodes have a circular shape. However, the shape may be elliptical, square, rectangular, or polygonal.

In the above-described example, a material having a composition containing $SrBi_2Nb_2O_9$ as a major component was used, to which Mn was added. By way of example, such materials to which Si and W are added may also be employed. Further, one can use such materials where at some of the Sr and Nb positions, other elements are substituted. Moreover, for the purpose of improving the sintering properties of ceramics, an assisting agent such as a glass component may be added to a composition containing Sr, Bi, Nb, and O as major components.

The major component of the piezoelectric material used for the piezoelectric device of this example is $SrBi_2Nb_2O_9$. However, the ratio in number of the elements may be different from the above composition to some degree, provided that the major compound essentially takes the crystal structure of $SrBi_2Nb_2O_9$ not departing from the scope of the present invention. Also in this case, the advantages of the present invention can be attained.

While one or more of the vibration electrodes may be located integrally of the piezoelectric substrate, it is preferable that they be located on the outer surfaces of the piezoelectric layers. This is true for the following reasons. In the case in which the piezoelectric device is used for an oscillator or a filter, it is necessary to adjust the resonant frequency at a desired value. The resonant frequency of the piezoelectric device depends on a piezoelectric material constituting the piezoelectric device, the types of the electrodes, the thickness of the device, and so forth. In many cases, a method of applying a coating material or the like to the vibration electrodes, and drying the coating to provide a mass load for the vibration electrodes is used for a final adjustment of the resonant frequency. This technique can be easily applied when the vibration electrodes are external electrodes and are exposed to the outside of the device. Further, a mass load is sometimes provided on the vibration electrodes by application of a coating material or the like to suppress spurious vibrations. In these cases, it is also preferable that the vibration electrodes be formed as external electrodes. As described above, if outermost vibration electrodes are external electrodes, a variety of actions on the vibration electrodes can be easily performed.

A high performance resonator with an excellent thermal resistance can be provided by use of the piezoelectric device of the present invention.

EXAMPLE 2

As in Example 1, a series of piezoelectric devices having the structure shown in FIGS. 1 and 2 were formed. The only difference between the samples in Example 2 was the diameter of the energy trapping region. In all cases, the piezoelectric substrate was formed as follows.

First, as starting materials, $SrCO_3$, $Bi_2O_3$, $TiO_2$, and $MnCO_3$ were prepared. These raw materials were weighed and mixed in such amounts as to produce a composition of $SrBi_4Ti_4O_{15}+1$ wt. % $MnCO_3$. The mixed powder was calcined at a temperature of 800 to 1000° C. Thereafter, an appropriate amount of an organic binder was added, and wet-pulverized for four hours by means of a ball mill. The grain size was adjusted by passing the powder through a 40 mesh sieve.

The raw material of which the grain size was adjusted was molded under a pressure of 1000 kg/cm$^2$ into a rectangular sheet with a size of 40 mm×25 mm×1.2 mm thick, and fired at a temperature of 1150 to 1300° C. for 1 to 5 hours in the atmosphere to produce a porcelain having a rectangular sheet shape. The porcelain was cut and polished to form a square sheet of 5 mm×5 mm×0.4 mm thick. The square sheet was polarized in thickness direction. Thereafter, silver electrodes were formed by vapor-deposition on both of the main faces as shown in FIG. 3. The size of the electrodes was varied from sample to sample. The diameter of the energy trapping region, that is, the diameter of the circular portion of each of the vibration electrodes was varied to be between 1.0 to 5.2 mm.

Figure 7:
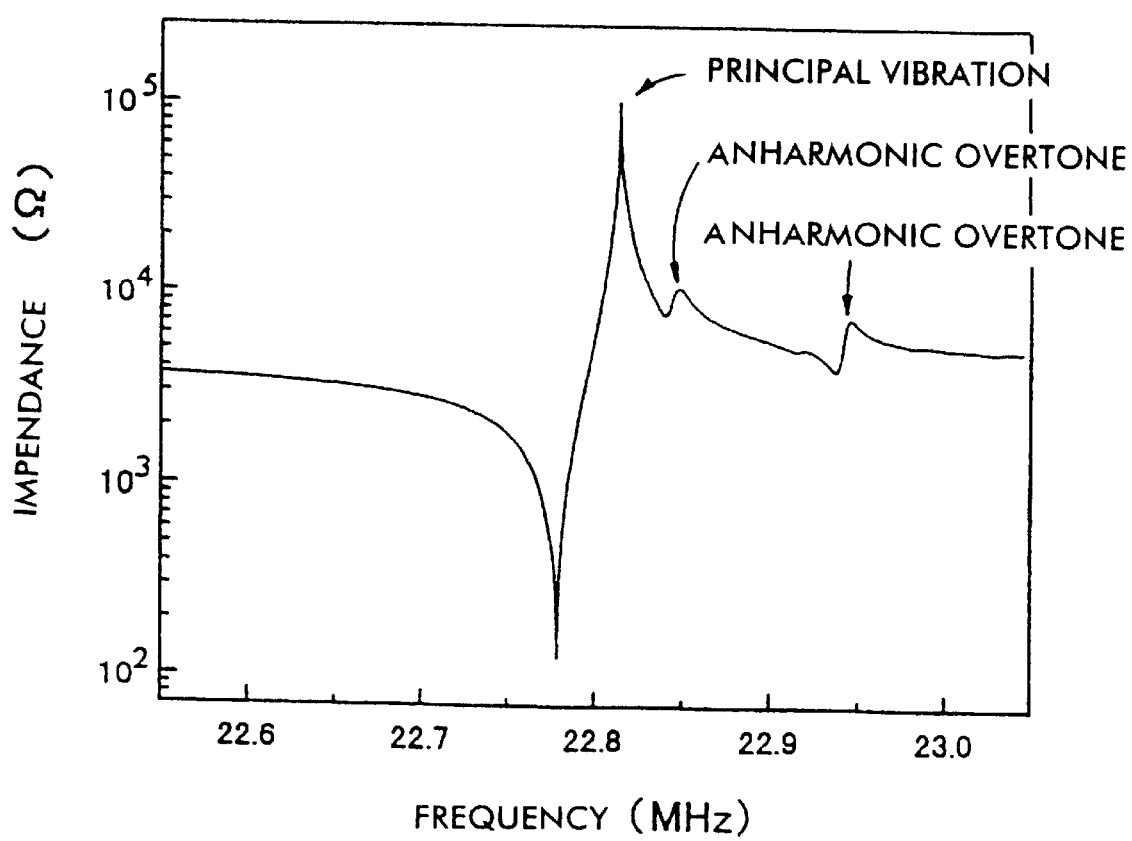
FIG. 7 is a graph showing the frequency characteristic of the impedance at an energy trapping range diameter of 3.6 mm in the Example 2.

For the purpose of estimating the energy trapping performance for a third harmonic wave of the piezoelectric device, an impedance analyzer 20 was connected, as shown in FIG. 3, and the frequency characteristic of the impedance was measured. FIG. 7 is a graph showing the impedance—frequency characteristic at an electrode diameter of 3.6 mm. In this case, L is 3.6 mm, and t is 0.4 mm, that is, the value L/t is 9. It is seen that in the piezoelectric device, anharmonic overtones are superposed on the resonant frequencies of the principal vibration.

Figure 8:
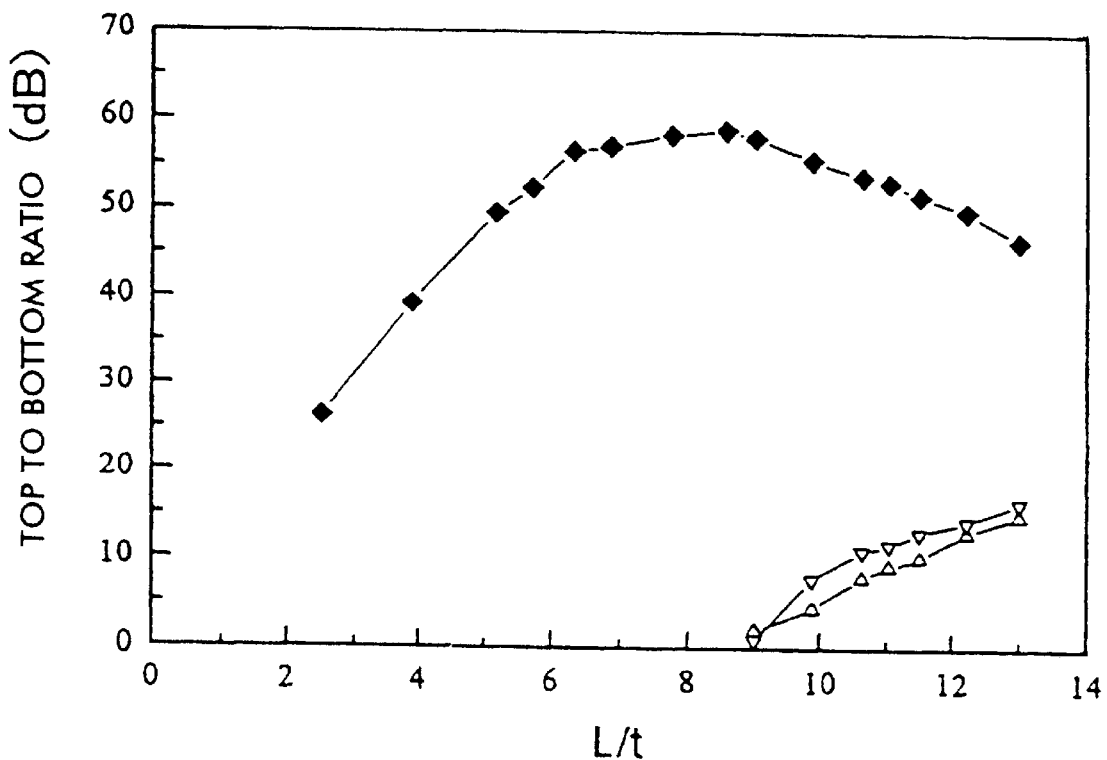
FIG. 8 is a graph showing the top-to-bottom ratio of the impedance of the piezoelectric device of Example 2 at different L/t values.

FIG. 8 shows the relations of the index L/t to the top-to-bottom ratios (the ratio of the resonant impedance to the anti-resonant impedance) of the principal vibration and the anharmonic overtones. As seen in FIG. 8, the anharmonic overtones are superposed when the value L/t is 9 and higher. If the piezoelectric device is used for an oscillator, the anharmonic overtones will cause abnormal oscillation, termination of oscillation, etc. If the piezoelectric device is used for a filter, the anharmonic overtones cause the problems that the attenuation is decreased, etc.

As described above, the piezoelectric device which has at least one pair of opposed (overlapping) energy-trapping vibration electrodes formed on opposite faces of a piezoelectric substrate comprising a material containing as a major component $SrBi_4Ti_4O_{15}$, which is a bismuth layer-structure compound type material, and excites a thickness extensional third harmonic wave can be used for a high performance piezoelectric resonator with an excellent thermal resistance by setting the size of the electrodes to have the value L/t of less than 9.

The composition containing $SrBi_4Ti_4O_{15}$ as a major component, to which Mn was added was used. Si and W may be added. Further, materials are available in which at some of the Sr and Ti positions other elements are substituted. Moreover, for the purpose of improving the sintering properties of ceramics, an assisting agent such as a glass component may be added to the composition containing $SrBi_4Ti_4O_{15}$ as a major component.

The major component of the piezoelectric material used for the piezoelectric device of this example includes Sr, Bi, Ti, and O, and is, e.g., $SrBi_4Ti_4O_{15}$. However, the ratio in number of the elements may be different from the above composition to some degree, provided that the compound substantially takes the crystal structure of $SrBi_4Ti_4O_{15}$, not departing from the scope of the present invention. Also in this case, the advantages of the present invention can be attained.

EXAMPLE 3

As in Examples 1 and 2, a series of piezoelectric devices having the structure shown in FIGS. 1 and 2 were formed. The only difference between the samples of Example 3 was the diameter of the energy trapping region. In all cases, the piezoelectric substrate was formed as follows.

First, as starting materials, $CaCO_3$, $Bi_2O_3$, $TiO_2$, and $MnCO_3$ were prepared. These raw materials were weighed and mixed in such amounts as to produce a composition of $CaBi_4Ti_4O_{15}+1$ wt. % $MnCO_3$. The mixed powder was calcined at a temperature of 800 to 1000° C. Thereafter, an appropriate amount of an organic binder was added, and wet-pulverized for four hours by means of a ball mill. The grain size was adjusted by passing the powder through a 40 mesh sieve.

The raw material of which the grain size was adjusted was molded under a pressure of 1000 kg/cm$^2$ into a rectangular sheet with a size of 40 mm×30 mm×1.0 mm thick, and fired at a temperature of 1100 to 1300° C. for 1 to 5 hours in the atmosphere to produce a porcelain having a rectangular sheet shape. The porcelain was cut and polished to form a square sheet of 5.5 mm×5.5 mm×0.4 mm thick. The square sheet was polarized in the thickness direction. Thereafter, silver electrodes were formed by vapor-deposition on both of the main faces as shown in FIG. 3. The size of the electrodes was varied from sample to sample. The diameter of the energy trapping region, that is, the diameter of the circular portion of each of the vibration electrodes was varied to be between 1.0 to 5.2 mm.

Figure 9:
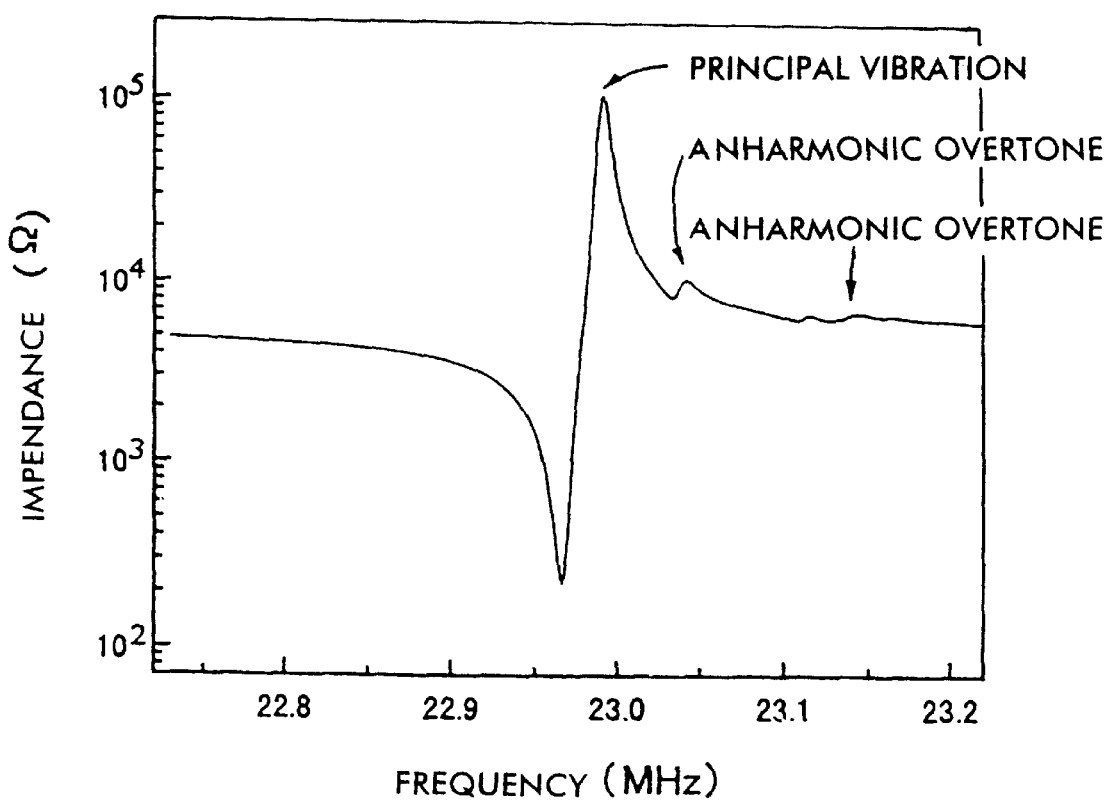
FIG. 9 is a graph showing the frequency characteristic of the impedance at an energy trapping range diameter of 3.6 mm in Example 3.

For the purpose of estimating the energy trapping performance for a third harmonic wave of the piezoelectric device, an impedance analyzer 20 was connected, as shown in FIG. 3, and the frequency characteristic of the impedance was measured. FIG. 9 is a graph showing the impedance—frequency characteristic at an electrode diameter of 3.6 mm. In this case, L is 3.6 mm, and t is 0.4 mm, that is, the value L/t is 9. It is seen that in the piezoelectric device, the anharmonic overtones are superposed on the resonant frequencies of the principal vibration.

Figure 10:
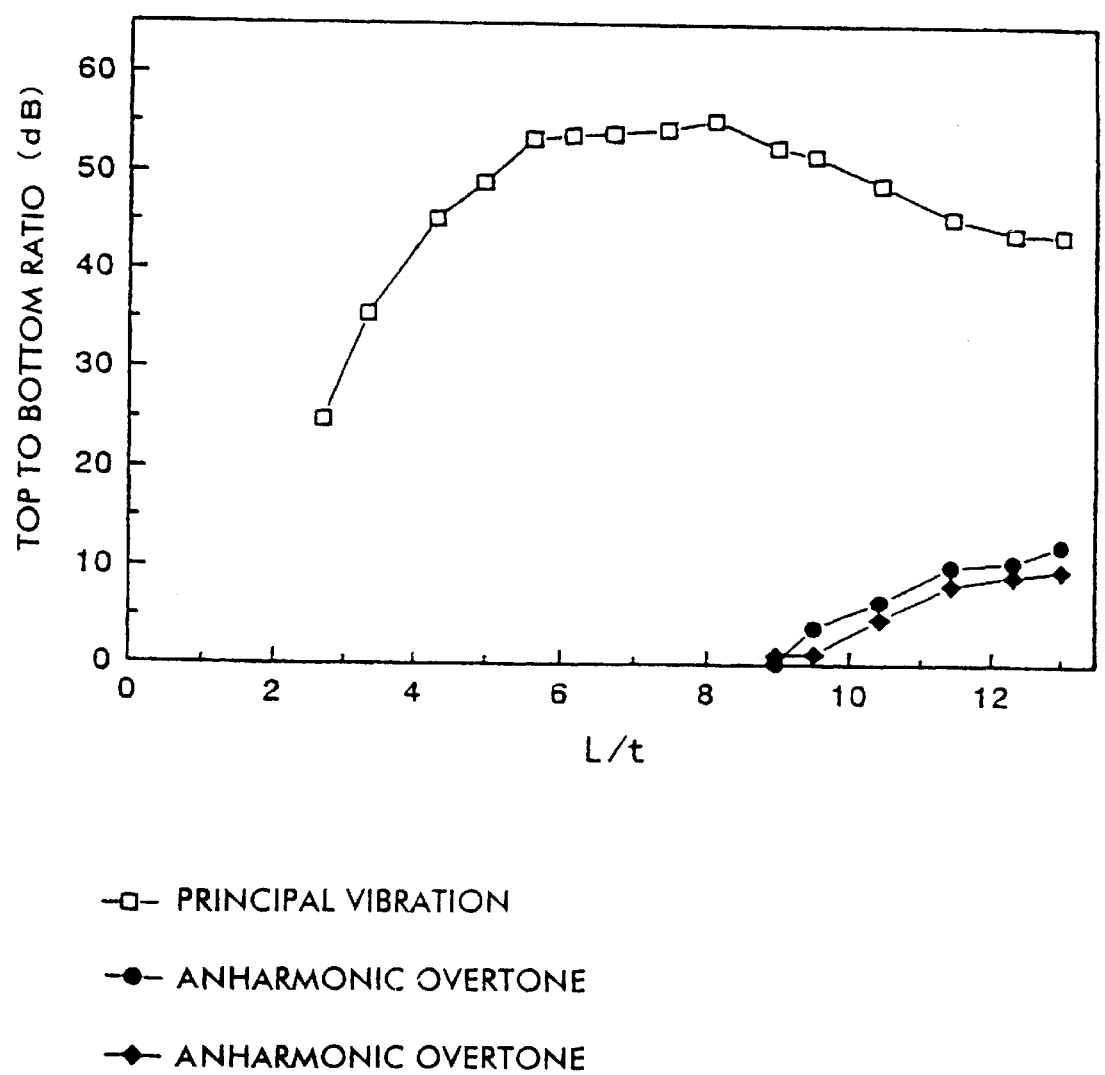
FIG. 10 is a graph showing the top-to-bottom ratio of the impedance of the piezoelectric device of Example 3 at different L/t values.

FIG. 10 shows the relationship of the index L/t to the top-to-bottom ratios (the ratio of the resonant impedance to the anti-resonant impedance) of the principal vibration and the anharmonic overtones. As seen in FIG. 10, the anharmonic overtones are superposed when the value L/t is 9 and higher. If the piezoelectric device is used for an oscillator, the anharmonic overtones will cause abnormal oscillation, termination of oscillation, etc. Further, if the piezoelectric device is used for a filter, the anharmonic overtones cause the problems that the attenuation is decreased, etc. The present invention overcomes these drawbacks.

To the composition containing $CaBi_2Ti_4O_{15}$ as a major component, to which Mn was added, was used. Other materials such as Si and W may be added. Further, such materials in which at a part of the Ca and Ti positions, other elements are substituted may be employed. Furthermore, such compositions containing $CaBi_2Ti_4O_{15}$ as a major component, to which an assisting agent such as a glass component is added in order to improve the sintering properties of ceramics, are available.

The major component of the piezoelectric material used in a piezoelectric device in accordance with the present invention includes Ca, Bi, Ti, and O, and is, e.g., $Ca_2Bi_4Ti_4O_{15}$. However, the ratio in number of the elements may be different from the above composition, provided that the material substantially takes the crystal structure of $CaBi_4Ti_4O_{15}$, not departing from the scope of the present invention. In this case, the advantages of the present invention can be also attained.

Figure 6:
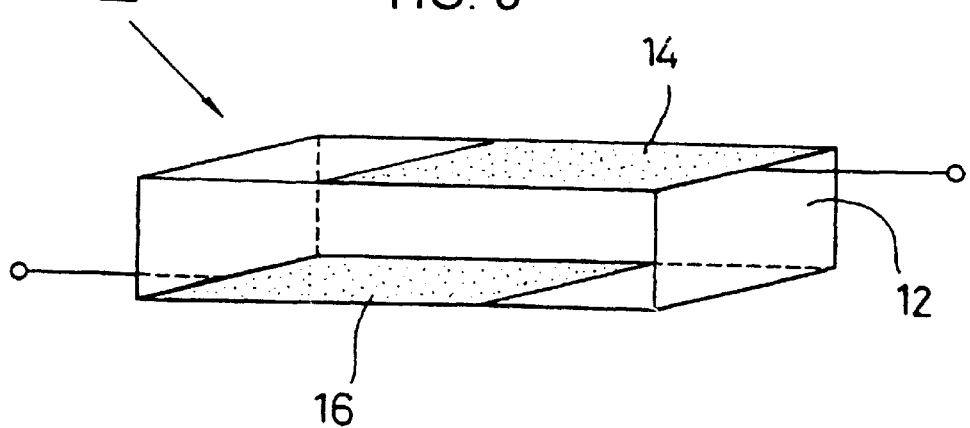
FIG. 6 illustrates a further example of the piezoelectric device of the present invention.

In the foregoing embodiments, the energy trapping electrodes were both circular in shape and completely overlapped one another. However, any desired shape electrode, in any degree of overlap, can be used. For example, in FIG. 6, the electrodes 14 and 16 are both rectangular in shape and only overlap one another toward the center of the piezoelectric substrate 12. While the two electrodes preferably have the same shape (e.g., circular), they may have different shapes (e.g., circular and oval) if desired. As long as the ratio L/t is maintained less than 9, the desired effects of the present invention are achieved.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A piezoelectric device comprising:
   a piezoelectric substrate comprising a piezoelectric material containing as major components Sr, Bi, Nb, and O; and
   at least one pair of vibration electrodes formed on opposite faces of the piezoelectric substrate so as to oppose each other and define an energy trapping region wherein a thickness extensional third harmonic wave is excited when an appropriate signal is applied across the pair of vibration electrodes, the length L of the longest secant extending between two intersections on the periphery of the energy confining region and the distance t between the pair of vibration electrodes satisfying the relationship l/t<9.

2. A piezoelectric device according to claim 1, wherein a major component for the piezoelectric material is $SrBi_2Nb_2O_9$.

3. A piezoelectric device according to claim 1, wherein the vibration electrodes fully overlap each other.

4. A piezoelectric device according to claim 1, wherein the vibration electrodes partially overlap one another.

5. A piezoelectric device according to claim 1, wherein the vibration electrodes are circular in shape.

6. A piezoelectric device according to claim 1, wherein the vibration electrodes are rectangular in shape.

7. A piezoelectric device according to claim 6, wherein said rectangular electrodes partially overlap one another.

8. A piezoelectric device comprising:
   a piezoelectric substrate comprising a piezoelectric material containing as major components Sr, Bi, Ti, and O; and
   at least one pair of vibration electrodes formed on opposite faces of the piezoelectric substrate so as to oppose each other and define an energy trapping region wherein a thickness extensional third harmonic wave is excited when an appropriate signal is applied across the pair of vibration electrodes, the length L of the longest secant extending between two intersections on the periphery of the energy confining region and the distance t between the pair of vibration electrodes satisfying the relationship l/t<9.

9. A piezoelectric device according to claim 8, wherein a major component for the piezoelectric material is $SrBi_4Ti_4O_{15}$.

10. A piezoelectric device according to claim 8, wherein the vibration electrodes fully overlap each other.

11. A piezoelectric device according to claim 8, wherein the vibration electrodes partially overlap one another.

12. A piezoelectric device according to claim 8, wherein the vibration electrodes are circular in shape.

13. A piezoelectric device according to claim 8, wherein the vibration electrodes are rectangular in shape.

14. A piezoelectric device according to claim 13, wherein said rectangular electrodes partially overlap one another.

15. A piezoelectric device comprising:
   a piezoelectric substrate comprising a piezoelectric material containing as major components Ca, Bi, Ti, and O; and
   at least one pair of vibration electrodes formed on opposite faces of the piezoelectric substrate so as to oppose each other and define an energy trapping region wherein a thickness extensional third harmonic wave is excited when an appropriate signal is applied across the pair of vibration electrodes, the length L of the longest secant extending between two intersections on the periphery of the energy confining region and the distance t between the pair of vibration electrodes satisfying the relationship l/t<9.

16. A piezoelectric device according to claim 15, wherein a major component for the piezoelectric material is $CaBi_4Ti_4O_5$.

17. A piezoelectric device according to claim 15, wherein the vibration electrodes fully overlap each other.

18. A piezoelectric device according to claim 15, wherein the vibration electrodes partially overlap one another.

19. A piezoelectric device according to claim 15, wherein the vibration electrodes are circular in shape.

20. A piezoelectric device according to claim 15, wherein the vibration electrodes are rectangular in shape.

21. A piezoelectric device according to claim 20, wherein said rectangular electrodes partially overlap one another.

* * * * *